(12) United States Patent
Inami et al.

(10) Patent No.: US 7,819,972 B2
(45) Date of Patent: Oct. 26, 2010

(54) METHOD FOR GROWING SILICON SINGLE CRYSTAL AND METHOD FOR MANUFACTURING SILICON WAFER

(75) Inventors: Shuichi Inami, Ogi (JP); Nobumitsu Takase, Saga (JP); Yasuhiro Kogure, Saga (JP); Ken Hamada, Saga (JP); Tsuyoshi Nakamura, Saga (JP)

(73) Assignee: Sumco Corporation, Tokyo (JP)

( * ) Notice: Subject to any disclaimer, the term of this patent is extended or adjusted under 35 U.S.C. 154(b) by 169 days.

(21) Appl. No.: 11/356,414

(22) Filed: Feb. 17, 2006

(65) Prior Publication Data
US 2006/0283379 A1 Dec. 21, 2006

Related U.S. Application Data

(60) Provisional application No. 60/693,977, filed on Jun. 27, 2005.

(30) Foreign Application Priority Data

Jun. 20, 2005 (JP) ............................... 2005-179997

(51) Int. Cl.
 *C30B 15/20* (2006.01)
(52) U.S. Cl. ............................. 117/13; 117/14; 117/15; 117/932
(58) Field of Classification Search ...................... 117/1; 257/1; 438/1; 428/1
See application file for complete search history.

(56) References Cited

U.S. PATENT DOCUMENTS

| | | | |
|---|---|---|---|
| 5,041,186 A * | 8/1991 | Nishio et al. ............... | 117/15 |
| 6,569,535 B2 * | 5/2003 | Murakami et al. .......... | 428/446 |
| 6,730,580 B2 * | 5/2004 | Chen et al. .................. | 438/474 |
| 2002/0081440 A1 | 6/2002 | Murakami et al. | |
| 2002/0139298 A1 | 10/2002 | Okui et al. | |

FOREIGN PATENT DOCUMENTS

| | | |
|---|---|---|
| EP | 1542269 A1 | 6/2003 |
| EP | 1785511 A1 | 8/2005 |
| EP | 1 598 452 A1 | 11/2005 |
| EP | 1892323 A1 | 2/2008 |
| JP | 2001-220289 | 8/2001 |
| JP | 2005-142434 | 6/2005 |
| WO | WO 2004/083496 A1 | 9/2004 |

OTHER PUBLICATIONS

European Search Report dated May 26, 2009 for 05806144.1-1215.

* cited by examiner

*Primary Examiner*—Robert M Kunemund
(74) *Attorney, Agent, or Firm*—Pillsbury Winthrop Shaw Pittman, LLP

(57) ABSTRACT

In a method for growing a silicon single crystal, a silicon single crystal is grown by the Czochralski method to have an oxygen concentration of $12 \times 10^{17}$ to $18 \times 10^{17}$ atoms/cm$^3$ on ASTM-F121 1979. A mixed gas of an inert gas and a gaseous substance containing hydrogen atoms is used as an atmospheric gas for growing the single crystal. A temperature of the silicon single crystal is controlled during the growth of the crystal such that the ratio Gc/Ge of an axial thermal gradient Gc at the central portion of the crystal between its melting point and its temperature of 1350° C. to an axial thermal gradient Ge at the periphery of the crystal between its melting point and its temperature of 1350° C. is 1.1 to 1.4. The axial thermal gradient Gc at the central portion of the crystal is 3.0 to 3.5° C./mm.

6 Claims, 5 Drawing Sheets

METHOD FOR GROWING SILICON SINGLE CRYSTAL AND METHOD FOR MANUFACTURING SILICON WAFER

CROSS-REFERENCE TO RELATED APPLICATIONS

This application claims the benefit of U.S. Provisional Patent Application No. 60/693,977, filed Jun. 27, 2005, and Japanese Patent Application No. 2005-179997, filed Jun. 20, 2005. The contents of these applications are hereby incorporated in their entirety by reference.

BACKGROUND OF THE INVENTION

1. Field of the Invention

The present invention relates to a method for manufacturing a silicon wafer which has an oxide precipitate density to allow a sufficient gettering capability, and a method for growing a silicon single crystal used as a raw material for the silicon wafer. Particularly, the invention relates to a method for growing a silicon single crystal to effectively manufacture a silicon single crystal having a body portion comprising an oxide precipitation promoting region (PV region) and/or oxide precipitation inhibiting region (PI region).

2. Description of Related Art

As a method for manufacturing a silicon single crystal as a raw material for a silicon wafer, a method for growing a silicon single crystal by the Czochralski method (hereafter referred as the CZ method) has been heretofore known.

It is well known that silicon single crystals manufactured by the CZ method include fine defects called grown-in defects. The occurrence of the grown-in defects becomes apparent during the manufacturing process of semiconductor devices. FIG. 1 is a schematic cross-sectional view for explaining a radial distribution of defects included in a silicon single crystal obtained by using the CZ method. As shown in FIG. 1, the grown-in defects of the silicon single crystal grown by the CZ method comprise void defects which are called infrared scattering defects or crystal originated particles (COPs), and fine dislocations which are called dislocation clusters. The void defects have a size on the order of 0.1 to 0.2 µm, and the fine dislocations have a size on the order of 10 µm.

In the silicon single crystal illustrated in FIG. 1, oxygen-induced stacking faults (hereafter referred as OSFs) occur in the ring form region having a diameter of about two-thirds of the outside diameter of the single crystal. In a region inside an OSF developing region in which the OSFs occur, infrared scattering defects on the order of $10^5$ to $10^6$ pieces/cm$^3$ are detected (infrared scattering defect developing region). Outside of the OSF developing region, there is a region including dislocation clusters on the order of $10^3$ to $10^4$ pieces/cm$^3$ (dislocation cluster developing region).

FIG. 2 is a drawing for explaining the state of a defect distribution at a cross section of the silicon single crystal grown by crystal pulling gradually decreasing its pulling rate. FIG. 1 is a cross-sectional view of the silicon single crystal grown at a pulling rate corresponding to the pulling rate shown by line A in FIG. 2.

As shown in FIG. 2, at a stage of fast pulling rate, the ring-shaped OSF developing region occurs on the periphery of the crystal. The inside of the OSF developing region comprises the infrared scattering defect developing region in which infrared scattering defects occur in large numbers. Along with decreasing pulling rate, the diameter of the OSF developing region decreases gradually, so that the dislocation cluster developing region in which the dislocation clusters occur appears outside the OSF developing region. Finally, the OSF developing region disappears and the dislocation cluster developing region appears in the entire cross section of the crystal.

Outside the ring-shaped OSF developing region, contacting the OSF developing region, there is an oxide precipitation promoting region (PV region) capable of forming oxide precipitates called bulk micro defects (BMDs). In the interstices between the oxide precipitation promoting region and the dislocation cluster developing region, there is an oxide precipitation inhibiting region (PI region) generating no BMDs. The oxide precipitation promoting region (PV region), the oxide precipitation inhibiting region (PI region), and the ring-shaped OSF developing region are each a defect-free region in which the grown-in defects are very few in number.

Compared with silicon single crystals, in which dislocation clusters are detected, silicon single crystals in which infrared scattering defects are detected have little adverse effect on semiconductor devices and are excellent in productivity because they can be grown by relatively fast pulling rate. However, as integrated circuits have become increasingly miniaturized in recent years, a decrease in dielectric strength of oxide has been pointed out due to infrared scattering defects, so that there is an increasing demand for a high-quality silicon single crystal which comprises a defect-free region where neither infrared scattering defects nor dislocation clusters are detected.

As a method for growing a silicon single crystal comprising a defect-free region, a method has been proposed for growing a silicon single crystal by using a hot zone structure where, for instance, a thermal gradient (Gc) at the central portion of the crystal is equal to or larger than a thermal gradient (Ge) at the periphery of the crystal (Gc≧Ge) (see, for example, Patent Document 1: PCT International Publication No. WO 2004/083496). FIG. 3 is a drawing for explaining the state of a defect distribution at the cross section of a silicon single crystal grown by pulling with gradually decreasing pulling rate. This single crystal is grown by using a crystal growing apparatus having a hot zone structure where a thermal gradient (Gc) at the central portion of the crystal is equal to or larger than a thermal gradient (Ge) at the periphery of the crystal (Gc≧Ge).

As shown in FIG. 3, when the crystal is grown at a pulling rate in a range of B to C shown in FIG. 3 by using the crystal growing apparatus having a hot zone structure satisfying Gc≧Ge, by the control of a thermal gradient G in the crystal near a solid-liquid interface, it is possible to grow a silicon single crystal which provides wafers having surfaces entirely comprising a uniform defect-free region. A pulling rate range for pulling a defect-free crystal (in FIG. 3, the range of B to C) is called the pulling rate margin of the defect-free crystal.

Furthermore, Patent Document 1 discloses a technique of increasing the pulling rate margin of a defect-free crystal by using a crystal growing apparatus having a hot zone structure which satisfies Gc≧Ge and by introducing hydrogen into an atmosphere in a pulling furnace. FIG. 4 is a drawing for explaining a state of a defect distribution at a cross section of a silicon single crystal grown by using the same crystal growing apparatus as that described in FIG. 3 having the hot zone structure which satisfies the relationship Gc≧Ge. In this case, while supplying an inert gas containing hydrogen into the furnace, the single crystal is grown by crystal pulling with gradually decreasing pulling rate.

When a mixed gas of an inert gas and hydrogen is used as an atmospheric gas used for growing a single crystal, since the hydrogen inhibits the occurrence of dislocation clusters caused by interstitial atoms, a pulling rate for a defect-free region is lowered. Therefore, compared with the example shown in FIG. 3 in which hydrogen is not introduced into the pulling furnace, as shown in FIG. 4, a minimum pulling rate for pulling up a defect-free crystal decreases and a pulling rate range for pulling up a defect-free crystal (the pulling rate margin of a defect-free crystal, that is, the range of D to E shown in FIG. 4) increases.

However, even when the pulling rate margin of the defect-free crystal is increased by introducing hydrogen into the pulling furnace as described in Patent Document 1, the extent of the pulling rate margin of the defect-free crystal is still insufficient to grow a silicon single crystal comprising one region selected from among the OSF developing region, the PV region, and the PI region. Therefore, these three regions tend to be mixed in the same crystal.

As described above, the OSF developing region is the defect-free region where neither infrared scattering defects nor dislocation clusters are detected; however, when the concentration of oxygen is high, an adverse effect may be exerted on device characteristics because occurrence of OSFs as secondary defects of oxide precipitates becomes apparent. Therefore, when a silicon single crystal comprising a defect-free region has been grown, it has been needed to control the oxygen content not more than $12 \times 10^{17}$ atoms/cm$^3$ (ASTM-F121 1979) such that the OSFs do not occur apparently. However, when the oxygen concentration of a silicon single crystal is controlled to have low value not more than $12 \times 10^{17}$ atoms/cm$^3$ (ASTM-F121 1979), such a single crystal may not provide a silicon wafer having sufficient density of oxide precipitates to allow a sufficient gettering capability.

When both the PV region and PI region are mixed in a silicon single crystal, the oxide precipitation characteristics such as density, size, and DZ width of the oxide precipitates may be inhomogeneous in the surface of a silicon wafer sliced from a grown silicon single crystal. That is, when the PV region and the PI region are mixed in the wafer, oxide precipitates distribute heterogeneously in the device processing, so that portions of high gettering capability and portions of low gettering capability are mixed within a wafer. In addition, although an active region near a device surface must be free of not only infrared scattering defects and dislocation clusters, but also oxide precipitates and their secondary defects such as OSFs and punch out dislocations, the width of a region free of such defects, that is, DZ width cannot be uniform in a wafer including both PV region and PI region. The non-uniform distributions of the gettering capability (IG capability) and the DZ width result in variations in device characteristics and a decrease in the yield of device production.

To solve the problems described above caused by the mixing state of the OSF developing region, the PV region, and the PI region in the defect-free crystal, it is possible to consider to grow a silicon single crystal by using the pulling rate margin only for the individual regions of the defect-free crystal (the range of D to E shown in FIG. 4). However, since such a growing condition further reduce the narrow range of the pulling rate margin of a defect-free crystal including the OSF developing region, the PV region, and the PI region, stable manufacture of a defect free crystal comprising only one region selected from the OSF developing region, the PV region, and the PI region has been difficult in terms of industrial production.

The present invention has been made in view of such consideration and has an object to provide a method for manufacturing a silicon wafer comprising an oxide precipitation promoting region (PV region) and/or an oxide precipitation inhibiting region (PI region), which have an oxide precipitate density to allow a sufficient gettering capability.

Another object of the invention is to provide a method for growing a silicon single crystal which allows the silicon single crystal whose body portion comprises an oxide precipitation promoting region (PV region) and/or an oxide precipitation inhibiting region (PI region) to be manufactured with a high yield.

SUMMARY OF THE INVENTION

In the method for growing a silicon single crystal of the present invention, a silicon single crystal having oxygen concentration of $12 \times 10^{17}$ to $18 \times 10^{17}$ atoms/cm$^3$ (ASTM-F121 1979) is grown by the Czochralski method. In the method, a mixed gas of an inert gas and a gaseous substance containing hydrogen atoms is used as an atmospheric gas for growing the single crystal. The temperature of the silicon single crystal during its growth process is controlled such that the ratio Gc/Ge of an axial thermal gradient Gc at the central portion of the crystal between its melting point and 1350° C. to an axial thermal gradient Ge at the periphery of the crystal between its melting point and 1350° C. is 1.1 to 1.4 and that an axial thermal gradient Gc at the central portion of the crystal is 3.0° C./mm to 3.5° C./mm. By such a method for growing a single crystal, the above described problem can be overcome.

In the method for growing the silicon single crystal, the side surface of the silicon single crystal can be cooled during the growth process of the crystal.

In the method for growing the silicon single crystal, it is possible to set the oxygen concentration at $13 \times 10^{17}$ to $16 \times 10^{17}$ atoms/cm$^3$ (ASTM-F121 1979).

In the method for growing the silicon single crystal, it is possible to set the oxygen concentration at $14 \times 10^{17}$ to $15 \times 10^{17}$ atoms/cm$^3$ (ASTM-F121 1979).

In the method for growing the silicon single crystal, a time period during which the temperature of the silicon single crystal during the growth process is in the range of 1000° C. to 800° C. can be controlled at 80 to 180 minutes.

In the method for growing the silicon single crystal, the hydrogen molecule partial pressure of the gaseous substance containing hydrogen atoms in the atmospheric gas can be set at 40 to 400 Pa.

In the method for growing the silicon single crystal, the body portion of the silicon single crystal can be made so as to comprise an oxide precipitation promoting region (PV region) and/or an oxide precipitation inhibiting region (PI region).

In the method for growing the silicon single crystal, the body portion of the silicon single crystal can be made so as to comprise an oxide precipitation inhibiting region (PI region).

In the method for manufacturing a silicon wafer according to the invention, the silicon wafer is sliced from the body portion of the silicon single crystal grown by using any one of the above described methods for growing the silicon single crystal and has an oxide precipitate density of $1 \times 10^4$ to $1 \times 10^6$ pieces/cm$^2$.

A silicon wafer of the invention is manufactured by using the manufacturing method described above.

In the method for growing a silicon single crystal according to the invention, atmospheric gas for growing the single crystal is made to contain gaseous substance containing hydrogen atoms. For example, the mixed gas of an inert gas and gaseous substance containing hydrogen atoms is used as the atmospheric gas. During the crystal growth, the temperature of the silicon single crystal is controlled such that the ratio Gc/Ge of the axial thermal gradient Gc at the central portion of the crystal between its melting point and 1350° C. to the axial thermal gradient Ge at the periphery of the crystal between its melting point and 1350° C. is 1.1 to 1.4 and that the axial thermal gradient Gc at the central portion of the crystal is 3.0° C./mm to 3.5° C./mm. By using such conditions it is possible to increase the pulling rate margin of a defect-free crystal.

Therefore, it is possible to grow a silicon single crystal through the use of a pulling rate margin by which the mixed state of the OSF developing region, the PV region, and the PI region is avoided. As a result, it is not necessary to lower the oxygen concentration to a low value not more than $12 \times 10^{17}$ atoms/cm$^3$ (ASTM-F121 1979) for reducing the occurrence of OSFs. Therefore, it is possible to manufacture a silicon single crystal having oxygen concentration of $12 \times 10^{17}$ to $18 \times 10^{17}$ atoms/cm$^3$ (ASTM-F121 1979).

The principle of the invention will be described below.

In a growing apparatus during the growth of the silicon single crystal, silicon melt contains dissolved hydrogen in an amount proportional to the partial pressure of the hydrogen contained in the inert gas atmosphere. Therefore, the hydrogen is distributed in the silicon crystal which solidifies from the silicon melt.

The concentration of the hydrogen in the silicon melt depends on the partial pressure of the hydrogen in the gaseous phase. The concentration can be determined based on Henry's law and is expressed by the following equation:

$$P_{H2} = kC_{LH2}$$

where $P_{H2}$ is the partial pressure of the hydrogen in the atmosphere, $C_{LH2}$ is the hydrogen concentration of the silicon melt, and k is a coefficient between them.

On the other hand, the hydrogen concentration of the silicon single crystal is determined by the relationship between the hydrogen concentration of the silicon melt and the segregation thereof and is expressed by the following equation:

$$C_{SH2} = k'C_{LH2} = (k'/k)P_{H2}$$

where $C_{SH2}$ is the hydrogen concentration of the crystal and k' is a segregation coefficient between the hydrogen in the silicon melt and the hydrogen in the crystal.

Therefore, when a silicon single crystal is grown in the inert gas atmosphere containing hydrogen, the hydrogen in the silicon single crystal immediately after the solidification can be controlled so as to have an even and desired concentration along the axial direction of the crystal by controlling the partial pressure of the hydrogen in the atmosphere. The hydrogen partial pressure can be controlled by the hydrogen concentration and a gas pressure in the furnace.

Almost all of the hydrogen, which has exerted an influence upon the formation of grown-in defects, dissipates outside the silicon single crystal during a subsequent cooling step.

When the mixed gas of the inert gas and the gaseous hydrogen atom-containing substance is used as the atmospheric gas used for the growth of the single crystal, the pulling rate margin of a defect-free crystal can be increased. And further, by controlling the partial pressure of the hydrogen contained in the inert gas atmosphere, it is possible to effectively increase the pulling rate margin for growing a crystal comprising a single region selected from individual regions of the defect-free crystal.

FIG. 5 is a graph showing a relationship between the hydrogen partial pressure in the atmospheric gas and a V/G ratio. So long as the hot zone structure is employed, a temperature distribution at the inside of the single crystal during the pulling thereof hardly changes even when the pulling rate is changed. Therefore, the change of V/G ratio shown in FIG. 5 corresponds to the change of pulling rate. As shown in FIG. 5, as the hydrogen partial pressure in the atmosphere increases, pulling rate for the defect-free crystal decreases, but the pulling rate margin of the defect-free crystal increases.

The pulling rate margin of the OSF region decreases with increasing hydrogen partial pressure. The pulling rate margin of the PI region definitely increases as the hydrogen partial pressure increases. The pulling rate margin of the PV region increases or decreases as the hydrogen partial pressure increases, while its pulling rate margin has a large value when the hydrogen partial pressure is 100 to 250 Pa.

In the method for growing a silicon single crystal according to the invention, as shown in FIG. 5, the pulling rate margin of the defect-free crystal can be effectively increased by setting the hydrogen molecule partial pressure of the gaseous substance containing hydrogen atoms in the atmospheric gas at 40 to 400 Pa. As a consequence, it is possible to easily grow a silicon single crystal which provides large-diameter silicon wafers having surfaces entirely comprising a defect-free crystal. And further, it is easy to separately manufacture a silicon single crystal for providing silicon wafers having surfaces entirely comprising a PV region, and a silicon single crystal for providing silicon wafers having surfaces entirely comprising a PI region.

It is not preferable to use the hydrogen molecule partial pressure of lower than 40 Pa because by such a partial pressure, the pulling rate margin of the defect-free crystal cannot be increased effectively. Further, the hydrogen molecule partial pressure exceeding 400 Pa is not preferable because by such a partial pressure, extremely large void defects called hydrogen defects tend to occur. By setting the hydrogen molecule partial pressure of the gaseous substance containing hydrogen atoms in the atmospheric gas at 400 Pa or lower, even when air leaks into the growing apparatus of the silicon single crystal, a safe operation can be performed without combustion.

As shown in FIG. 5, the setting of the hydrogen molecule partial pressure of the gaseous substance containing hydrogen atoms in the atmospheric gas at 40 to 160 Pa (the range I shown in FIG. 5) makes it possible to easily grow a silicon single crystal for providing silicon wafers having surfaces entirely comprising a PV region. When the hydrogen molecule partial pressure exceeds 160 Pa, the PI region tends to occur concurrently, which makes it difficult to grow a silicon single crystal for providing silicon wafers having surfaces entirely comprising a PV region. Since the PV region tends to generate oxide precipitates, a silicon wafer comprising the PV region allows oxide precipitates having a gettering effect to be easily formed therein when the surface of the wafer is subjected to, for instance, a process for forming a so-called DZ (denuded zone) layer.

As shown in FIG. 5, by setting the hydrogen molecule partial pressure of the gaseous substance containing hydrogen atoms in the atmospheric gas at 160 to 400 Pa (the range II shown in FIG. 5), it is possible to easily grow a silicon single crystal for providing silicon wafers having surfaces entirely comprising a PI region. Also, since the OSF developing region can be reduced, wafers can be easily manufactured which comprise a defect-free crystal having high oxygen concentration. When the hydrogen molecule partial pressure is lower than 160 Pa, the PV region tends to occur concurrently, which makes it difficult to grow a silicon single crystal for providing silicon wafers having surfaces entirely comprising a PI region.

Furthermore, since the thermal gradient G in the crystal near the solid-liquid interface is controlled by using a growing apparatus having a hot zone structure which realizes a Gc/Ge ratio of 1.1 to 1.4 and an axial thermal gradient Gc of 3.0 to 3.5° C./mm, it is possible to more effectively increase the pulling rate margin of the defect-free crystal.

FIG. 6 is a drawing for explaining the state of a defect distribution at the cross section of a silicon single crystal grown by using a growing apparatus having a hot zone structure which realizes a Gc/Ge ratio of 1.1 to 1.4 and an axial thermal gradient Gc of 3.0 to 3.3° C./mm and by gradually reducing the pulling rate during the crystal pulling. FIG. 7 is a drawing for explaining the state of a defect distribution at the cross section of a silicon single crystal grown by using a growing apparatus having the same hot zone structure as that shown in FIG. 6 and by supplying a hydrogenated inert gas into the pulling furnace and gradually reducing the pulling rate during the crystal pulling A hot zone structure which realizes a Gc/Ge ratio of 1.1 to 1.4 and an axial thermal gradient Gc of 3.0 to 3.5° C./mm can be obtained by, for instance, improving the size and position of a heat shield, which surrounds the periphery of a single crystal immediately after the solidification thereof, and cooling the side surface of the silicon single crystal during the crystal growth with a cooling unit.

In the hot zone structures having been used for the growth of the silicon single crystals shown in FIG. 6 and FIG. 7, a time period during which the temperature of the silicon single crystals during the crystal growth is in the range of 1000° C. to 800° C., that is to say, a time period during which the silicon single crystals are exposed to the temperature range of 1000° C. to 800° C. during the crystal growth is 180 minutes or less.

For instance, the example of the growth of the silicon single crystals described with reference to FIG. 1 and FIG. 2 are provided by using a hot zone structure in which a controlling of temperature for controlling thermal gradient G is not conducted. In such a hot zone structure, a thermal gradient (Gc) at the central portion of the crystal is smaller than a thermal gradient (Ge) at the periphery of the crystal (Gc<Ge) and a time period during which the temperature of the silicon single crystal during the crystal growth is in the range of 1000° C. to 800° C. exceeds 180 minutes. In the example of the growth of the silicon single crystal described with reference to FIG. 3, a time period during which the temperature of the silicon single crystal during the crystal growth is in the range of 1000° C. to 800° C. is 80 minutes to 180 minutes.

The time period during which the temperature of the silicon single crystal during the crystal growth is in the range of 1000° C. to 800° C. means a temperature range in which the OSF nucleus grows in the silicon single crystal. In the example of the growth of the silicon single crystal shown in FIG. 6, since the time period during which the temperature of the silicon single crystal during the crystal growth is in the range of 1000° C. to 800° C. is short compared with those described in the examples shown with reference to FIG. 2 and FIG. 3, the growth of the OSF nucleus in the silicon single crystal is inhibited, thereby the pulling rate margin of the defect-free crystal is increased.

Also, by using the growing apparatus having the hot zone structure which realizes the Gc/Ge ratio of 1.1 to 1.4 and the axial thermal gradient Gc of 3.0 to 3.5° C./mm, the thermal gradient G in the crystal near the solid-liquid interface is increased, so that the pulling rate V can be increased without changing the V/G ratio, thereby the minimum pulling rate for pulling the defect-free crystal can be improved. Furthermore, by growing a silicon single crystal through the use of such a method, the controllability of the V/G ratio can be improved at the time of pulling the silicon single crystal.

By using a growing apparatus having such a hot zone structure, the growth of the single crystal can be controlled so as to satisfy $$(fpD-fpR)/fpD \times 100 = \pm 20(\%)$$

where fpD is a rate for growing the portion m, as shown in FIG. 6, protruding in the axial direction of the central portion at the interface between the PV region and OSF developing region, and fpR is a rate for growing a portion n, as shown in FIG. 6, which bulges in ring form (a portion protruding in the axial direction at a midpoint between the center of the crystal and the outermost portion of the crystal in the radial direction of the crystal).

When the hydrogenated inert gas is supplied into the pulling furnace as shown in FIG. 7, it is possible to increase the pulling rate margin of the defect-free crystal (the range of F to G indicated in FIG. 7) compared with the pulling rate margin of the defect-free crystal shown in the example of FIG. 6 (the range of F to G), in which an inert gas was used as the atmospheric gas.

As shown in FIG. 7, since the pulling rate margins of the oxide precipitation promoting region (PV region) and the oxide precipitation inhibiting region (PI region) (the range of H to G shown in FIG. 7) are increased by growing the silicon single crystal through the use of such a method, it is possible to obtain a silicon single crystal for providing wafers having surfaces entirely comprising a PV region, and a silicon single crystal providing wafers entirely comprising a PI region.

As described above, according to the invention, it is possible to grow a silicon single crystal using a pulling rate margin to avoid the mixed state of the OSF developing region, the PV region, and the PI region. Therefore, it is possible to manufacture a silicon single crystal having an oxygen concentration of $12 \times 10^{17}$ to $18 \times 10^{17}$ atoms/cm$^3$ (ASTM-F121 1979). By slicing wafers from a body portion of the grown silicon single crystal, it is possible to obtain silicon wafers with the oxide precipitate density of $1 \times 10^4$ to $1 \times 10^6$ pieces/cm$^3$ to allow sufficient gettering capability.

When the oxygen concentration is lower than $12 \times 10^{17}$ atoms/cm$^3$, there is a possibility that the oxide precipitate density for sufficient gettering capability may not be obtained in the silicon wafers sliced from the grown silicon single crystal. When the oxygen concentration exceeds $18 \times 10^{17}$ atoms/cm$^3$, there is a possibility that OSFs are detected in the silicon wafers sliced from the grown silicon single crystal.

The oxygen concentration can be controlled by controlling the number of revolutions of a crucible, a gas pressure in the furnace, and the temperature of a heater. In the present invention, by manufacturing a silicon single crystal having an oxygen concentration of $13 \times 10^{17}$ to $16 \times 10^{17}$ atoms/cm$^3$, more preferably, oxygen concentration of $14 \times 10^{17}$ to $15 \times 10^{17}$ atoms/cm$^3$ (ASTM-F121 1979), it is possible to obtain a silicon wafer having a much superior gettering capability.

In the method for growing a silicon single crystal according to the invention, hydrogen gas can be used as the gaseous substance containing hydrogen atoms, while it is possible to use at least one of the gases selected from gaseous inorganic compounds containing hydrogen atoms such as $H_2O$, $CH_4$, and HCl, gaseous hydrocarbons such as silane gas and $CH_4.C_2H_2$, and the gases of various substances containing hydrogen atoms such as alcohol and carboxylic acid.

When hydrogen gas is used as the gaseous substance containing hydrogen atoms, it is possible to supply hydrogen gas from a commercial hydrogen gas cylinder, hydrogen gas storage tank, hydrogen tank storing hydrogen in a hydrogen storage alloy, or the like into the pulling furnace through a dedicated pipe.

As the inert gas (rare gas), at least one of the gases selected from the group consisting of Ar, He, Ne, Kr, and Xe can be used. Generally, inexpensive argon (Ar) gas is used, while it is possible to use a mixed gas consisting of Ar gas and He, Ne, Kr, Xe or combinations thereof.

The concentration of oxygen gas ($O_2$) in the atmospheric gas is set so as to satisfy the equation $$\alpha - 2\beta \geq 3\% \text{ (volume \%)}$$

where $\alpha$ is the concentration of the gaseous substance containing hydrogen atoms calibrated to the concentration of hydrogen molecule and $\beta$ is the concentration of the oxygen gas ($O_2$). When the concentration $\beta$ of the oxygen gas ($O_2$) and the concentration $\alpha$ of the gaseous substance containing hydrogen atoms calibrated to the concentration of the hydrogen molecule in the atmospheric gas do not satisfy the equation, the effect for inhibiting the occurrence of grown-in defects by the hydrogen atoms captured in the silicon single crystal cannot be obtained.

In the method for manufacturing a silicon single crystal according to the invention, the atmospheric gas may have a nitrogen ($N_2$) concentration of at most 20% by volume when the gas pressure in the furnace is in the range of 4 to 6.7 kPa (30 to 50 Torr).

When the nitrogen concentration exceeds 20% by volume, dislocations may occur in the silicon single crystal.

According to the present invention, it is possible to provide a method for manufacturing a silicon wafer comprising an oxide precipitation promoting region (PV region) having an oxide precipitate density to allow sufficient gettering capability and/or an oxide precipitation inhibiting region (PI region).

DETAILED DESCRIPTION OF THE INVENTION

A first embodiment according to the present invention will be described below with reference to the drawings.

Figure 1:
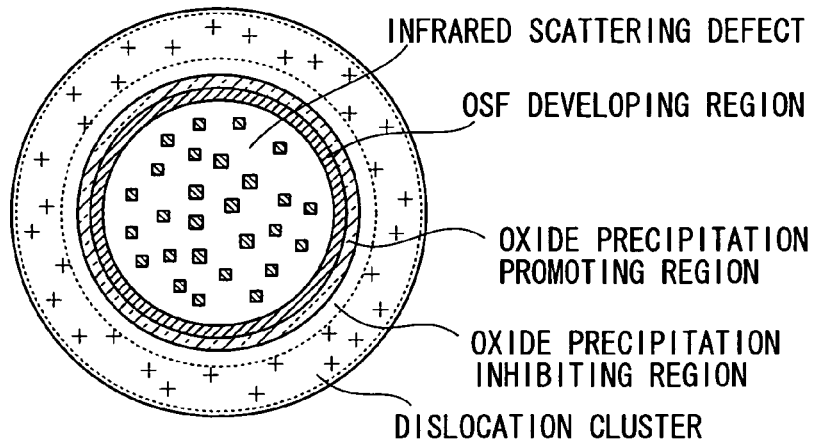
FIG. 1 is a cross-sectional view for explaining the state of a defect distribution in the axial direction of a silicon single crystal grown by a CZ method.
Figure 2:
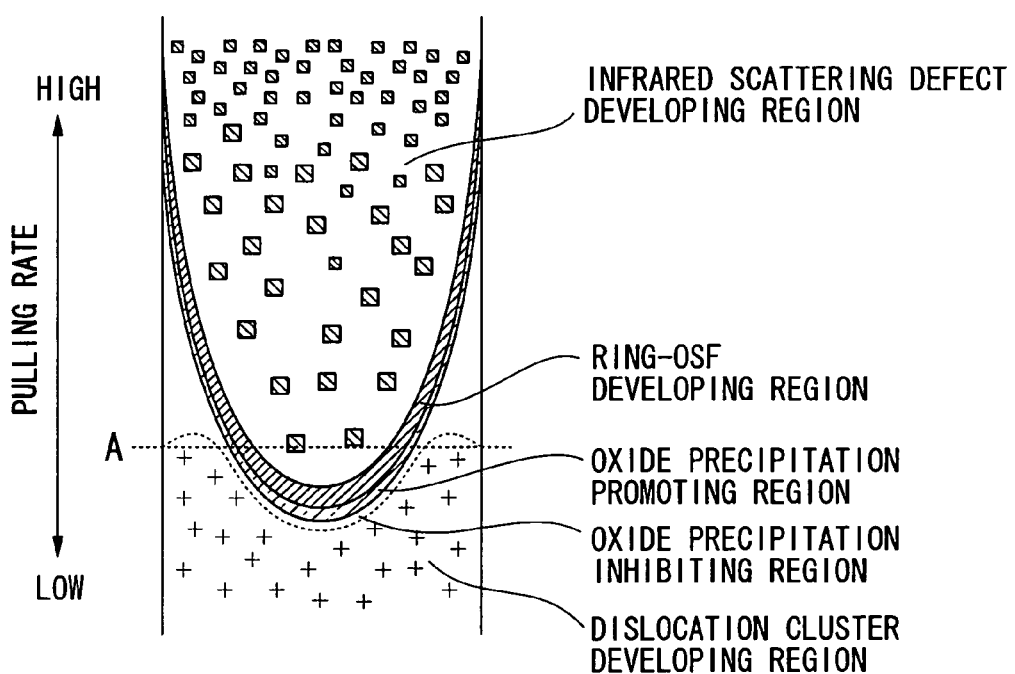
FIG. 2 is a drawing for explaining the state of a defect distribution at a cross section of a silicon single crystal grown by using a growing apparatus having a hot zone structure, which forms a thermal gradient (Gc) at the central portion of the crystal smaller than a thermal gradient (Ge) at the periphery of the crystal (Gc<Ge) by not conducting a temperature control used for controlling a thermal gradient G at the side of the silicon single crystal, and by gradually decreasing the pulling rate of the crystal during the pulling thereof.
Figure 3:
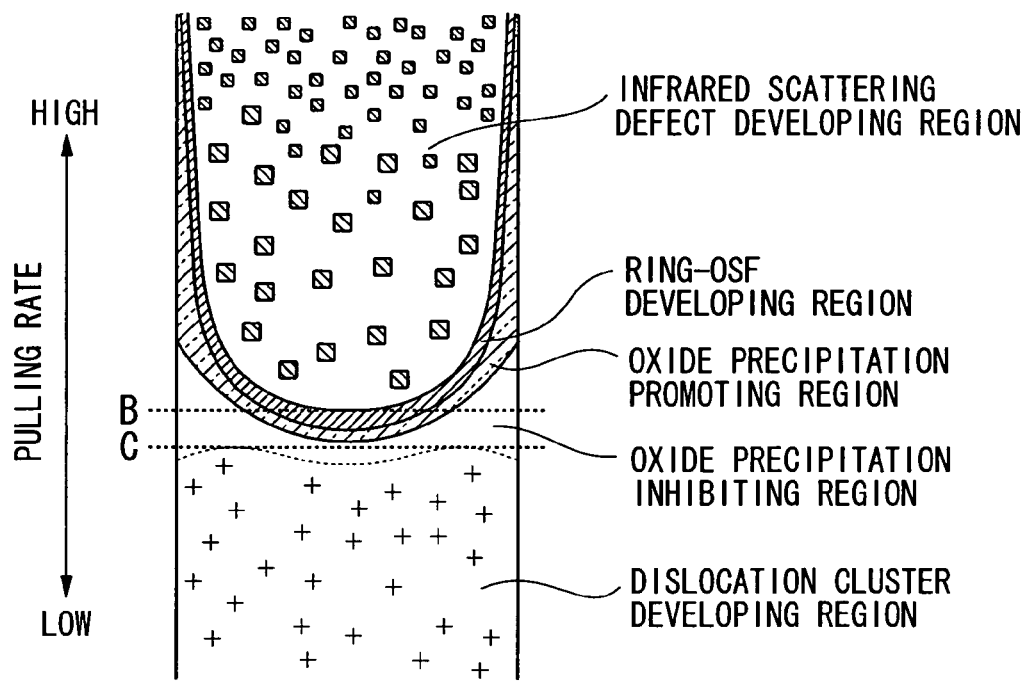
FIG. 3 is a drawing for explaining the state of a defect distribution at a cross section of a silicon single crystal grown by using a growing apparatus having a hot zone structure, which makes a thermal gradient (Gc) at the central portion of the crystal equal to or larger than a thermal gradient (Ge) at the periphery of the crystal (Gc≧Ge) by cooling the side of the silicon single crystal during the crystal growth, and by gradually decreasing the pulling rate of the crystal during the pulling thereof.
Figure 4:
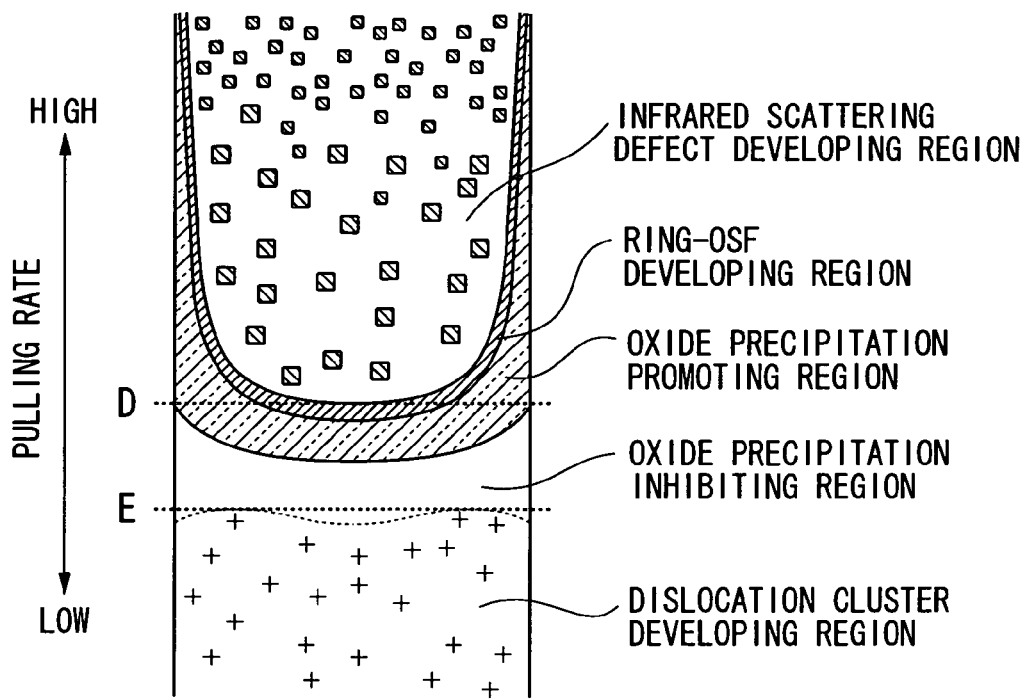
FIG. 4 is a drawing for explaining the state of a defect distribution at a cross section of a silicon single crystal grown by using a growing apparatus having a hot zone structure, which makes a thermal gradient (Gc) at the central portion of the crystal equal to or larger than a thermal gradient (Ge) at the periphery of the crystal (Gc≧Ge) by supplying a hydrogenated inert gas into a furnace, cooling the side of the silicon single crystal during the crystal growth, and gradually decreasing the pulling rate of the crystal during the pulling thereof.
Figure 5:
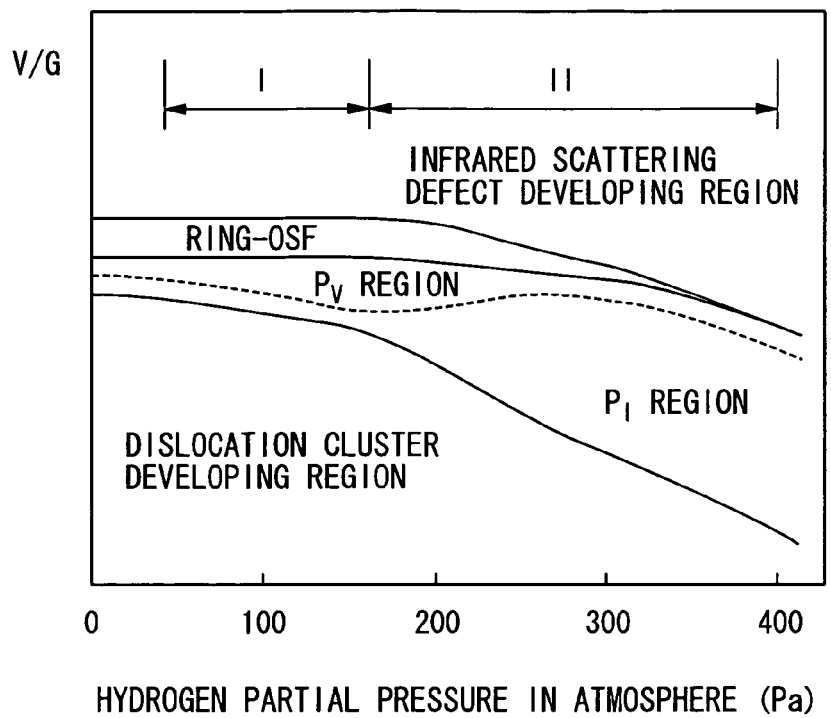
FIG. 5 is a graph for explaining a relationship between a hydrogen partial pressure in an atmosphere and a V/G ratio.
Figure 6:
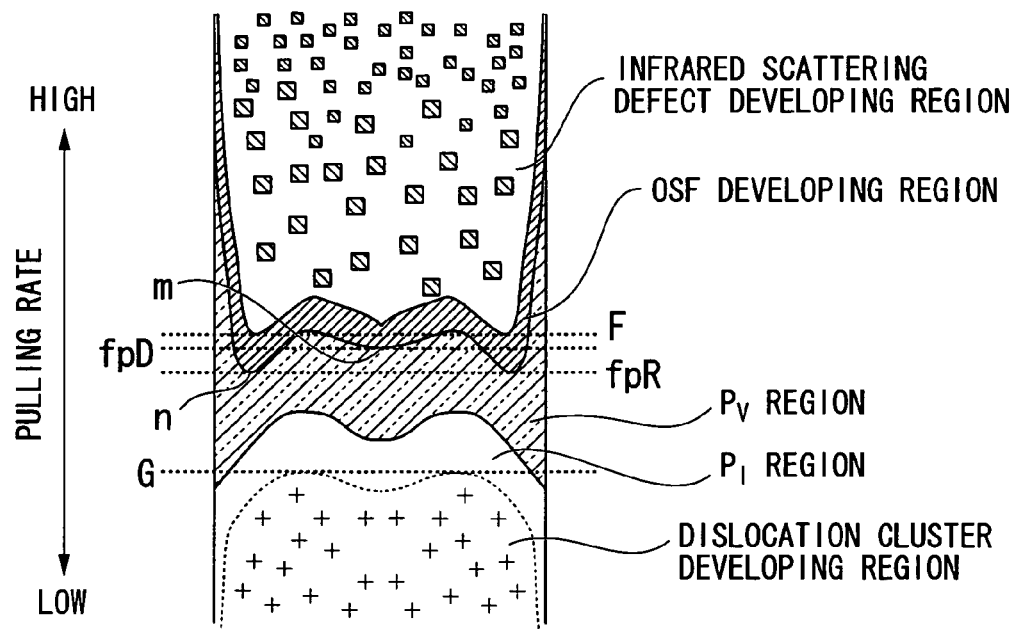
FIG. 6 is a drawing for explaining the state of a defect distribution at a cross section of a silicon single crystal grown by using a growing apparatus having a hot zone structure, which realizes a Gc/Ge ratio of 1.1 to 1.4 and an axial thermal gradient Gc of 3.0 to 3.3° C./mm, and by gradually decreasing the pulling rate during the crystal pulling.
Figure 7:
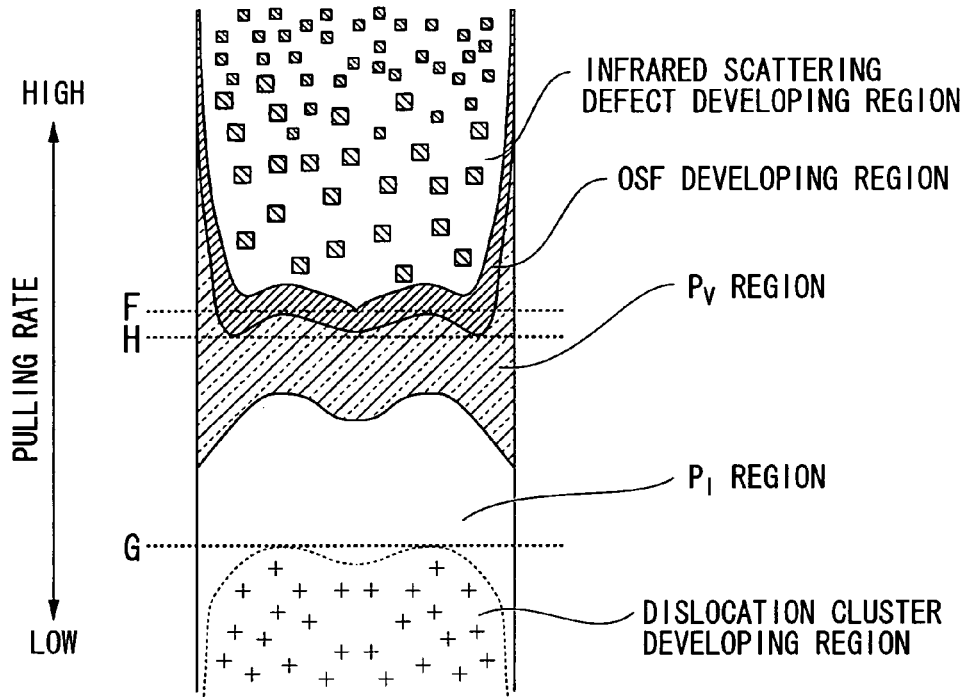
FIG. 7 is a drawing for explaining the state of a defect distribution at a cross section of a silicon single crystal grown by using a growing apparatus having a hot zone structure, which realizes a Gc/Ge ratio of 1.1 to 1.4 and an axial thermal gradient Gc of 3.0 to 3.3° C./mm, supplying a hydrogenated inert gas into a pulling furnace, and gradually decreasing the pulling rate during the crystal pulling.
Figure 8:
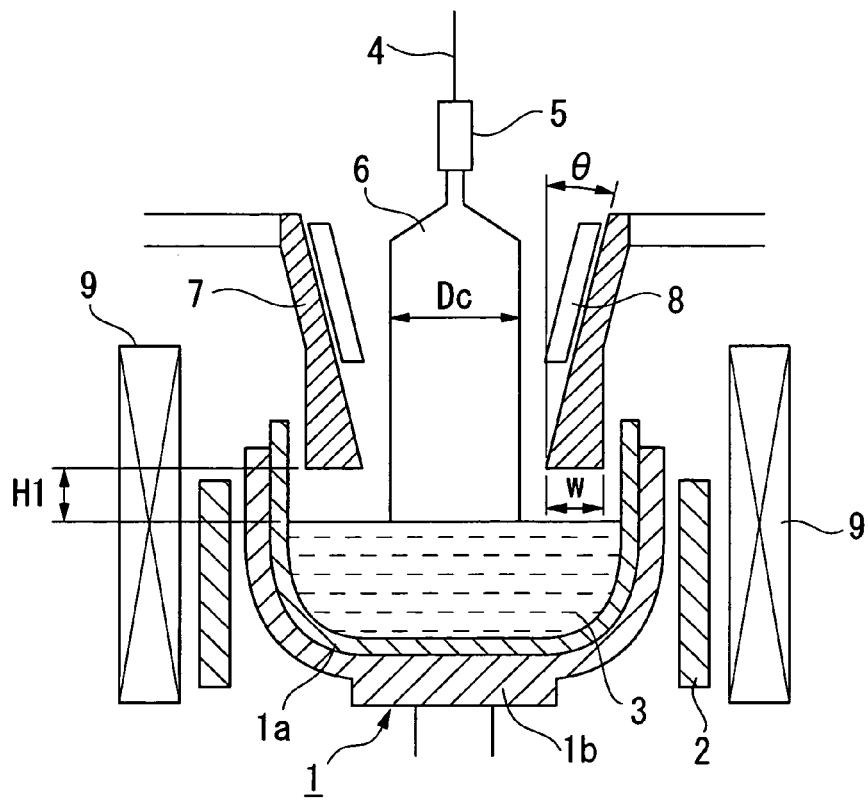
FIG. 8 is a longitudinal sectional view of a CZ furnace suitable for carrying out a method for growing a silicon single crystal according to the invention.

FIG. 8 is a longitudinal sectional view of a CZ furnace suitable for carrying out a method for growing a silicon single crystal according to the first embodiment.

The CZ furnace shown in FIG. 8 is provided with a crucible 1 placed at the central portion of the inside of a chamber, a heater 2 placed outside the crucible 1, and a magnetic field supply unit 9 placed outside the heater 2. The crucible 1 has a dual structure, in which a quartz crucible 1b containing a silicon melt 3 inside is supported by a graphite crucible 1b placed outside the quartz crucible 1a, and is rotated and moved up and down by a support shaft called a pedestal.

Above the crucible 1, a cylindrical heat shield 7 is provided. The heat shield 7 has a structure in which its shell is made of graphite and its inside is packed with graphite felt. The inner surface of the heat shield 7 has a tapered shape in which its inner diameter gradually decreases from its upper end to its lower end. The upper outer surface of the heat shield 7 has a tapered shape which corresponds to the shape of its inner surface. The lower outer surface of the heat shield 7 is formed so as to become almost straight in such a way that the thickness of the heat shield 7 gradually increases downward.

The CZ furnace has a hot zone structure which realizes a ratio Gc/Ge of an axial thermal gradient Gc at a central portion of a crystal between its melting point and 1350° C. to an axial thermal gradient Ge at a periphery of the crystal between its melting point and 1350° C. of 1.1 to 1.4 and preferably 1.2 to 1.4. The hot zone structure also realize a thermal gradient Gc of 3.0 to 3.5° C./mm and preferably 3.2 to 3.3° C./mm. A time period during which the temperature of the silicon single crystal during the crystal growth is in the range of 1000° C. to 800° C., that is to say, a time period during which the silicon single crystal during the crystal growth passes the temperature range of 1000° C. to 800° C. is 80 to 180 minutes and preferably 100 to 150 minutes. Such a hot zone structure comprises the heat shield 7 and a water cooling unit 8 (cooling unit).

Since the heat shield 7 is used to intercept radiant heat which radiates from the heater 2 and the surface of the silicon melt 3 to the side of a silicon single crystal 6, the heat shield 7 surrounds the side of the silicon single crystal 6 during the crystal growth and the surface of the silicon melt 3. The following is one example of a structural requirement of the heat shield 7.

The width in its radial direction W is set at, for example, 50 mm, the angle of inclination of its inner surface, which takes the shape of an inverted truncated cone, to the vertical direction θ is set at, for example, 21°, and the height from the surface of the melt to the lower end of the heat shield 7 H1 is set at, for example, 60 mm.

The water cooling unit 8 is attached inside the heat shield 7. By attaching the water cooling unit 8 inside the heat shield 7, the side of the silicon single crystal 6 can be cooled effectively. And further, the precipitation of SiO to the water cooling unit 8 is inhibited by the flow of inert gas which descends through the inside of the heat shield 7 at high velocity.

Examples of the water cooling unit 8 include a coil-type water flow pipe comprising copper, stainless steel, or the like and a water cooling jacket having a water flow partition. The rate of water flow of the water cooling unit 8 is preferably at least 10 liters/minute. The cooling capacity of the water cooling unit 8 can be controlled by adjusting a height in the crystal pulling direction of the water cooling unit 8 and an installation space between the surface of the melt and the water cooling unit 8. The structure of the water flow pipe or the water cooling jacket can be changed suitably according to the rate of water flow. By controlling the cooling capacity of the water cooling unit 8, a thermal stress applied to the side of the silicon single crystal during the crystal growth changes in the range of 30 to 45 MPa and the time period during which the temperature of the silicon single crystal during the crystal growth is in the range of 1000° C. to 800° C. changes in the range of 80 to 180 minutes.

In addition, where Dc is the diameter of a single crystal to be pulled up, it is desirable that the water cooling unit 8 be designed such that a cooling member has an inner diameter of 1.20 Dc to 2.50 Dc and a length of 0.25 Dc or more and that a distance from the surface of the melt to the bottom surface of the cooling member is in the range of 0.30 Dc to 0.85 Dc.

A magnetic field strength supplied from a magnetic field supply apparatus 9 is 2000 G to 4000 G and preferably 2500 G to 3500 G when a horizontal magnetic field (lateral magnetic field) is applied. The height from the surface of the melt to the center of the magnetic field is set so as to be in the range of −150 mm to +100 mm and more preferably −75 mm to +50 mm.

Also, when a cusp magnetic field is applied, a magnetic field strength supplied from the magnetic field supply apparatus 9 is 200 G to 1000 G and preferably 300 G to 700 G. The height from the surface of the melt to the center of the magnetic field is set so as to be in the range of −100 mm to +100 mm and more preferably −50 mm to +50 mm.

By supplying a magnetic field from the magnetic field supply apparatus 9 through the use of such magnetic field strengths and height ranges of the magnetic field centers, the convection of the melt can be suppressed, which makes it possible to form a preferable shape at the solid-liquid interface.

When the silicon single crystal 6 is pulled up by using the CZ furnace shown in FIG. 8, the axial thermal gradient Gc at the central portion of the crystal between its melting point and 1350° C. is 3.0 to 3.2° C./mm, the axial thermal gradient Ge at the periphery of the crystal is 2.3 to 2.5° C./mm, and the Gc/Ge ratio is approximately 1.3. Also, a thermal stress applied to the side of the silicon single crystal during the crystal growth is 30 to 45 MPa. Such a state remains about the same even when the pulling rate is changed.

Next, a method for growing the silicon single crystal 6 will be described through the use of the CZ furnace shown in FIG. 8 and a mixed gas of an inert gas and hydrogen gas serving as an atmospheric gas used for the crystal growth.

[Setting of Operational Conditions]

The setting of operational conditions for the growth of the silicon single crystal having a target defect state is conducted. As an example of the setting of operational conditions, a method for setting operational conditions for the growth of a defect-free crystal comprising an oxide precipitation inhibiting region (PI region) will be described. Firstly, to evaluate the allowable range of hydrogen concentration and a pulling rate for growing a defect-free crystal, the mixing ratios of hydrogen molecule in the atmospheric gas is set to have partial pressures such as 0, 20, 40, 160, 240, and 400 Pa, and then, a single crystal with a target diameter of, for example, 300 mm is grown in accordance with the individual conditions.

That is, polycrystalline silicons of high purity (for example, 300 Kg) are charged into the crucible, and then a p-type dopant (such as B, Al, or Ga) or an n-type dopant (such as P, As, or Sb) is added so as to set the electric resistivity of the single crystal at a desired value such as 10 Ωcm. The gas pressure in the apparatus is set at a reduced pressure of 1.33 to 26.7 kPa (10 to 200 torr) in an argon atmosphere and the partial pressure of hydrogen molecule of the atmospheric gas is controlled to provide the gas being introduced into the furnace with the above-described predetermined mixing ratio of hydrogen.

Then, a horizontal magnetic field of, for example, 3000 G is applied from the magnetic field supply apparatus 9 such that the height from the center of the magnetic field to the surface of the melt is −75 mm to +50 mm. The silicon polycrystals are heated by the heater 2 to give a silicon melt 3. A seed crystal held by a seed chuck 5 is dipped into the silicon melt 3, following which the crystal is pulled up while rotating the crucible 1 and a pulling shaft 4. At this time, the number of crucible revolutions, the furnace pressure, the temperature of the heater, and so on are controlled such that a desired oxygen concentration is obtained. The orientation of the crystal is set at any one of {100}, {111}, and {110}. A seed drawing is conducted to obtain a crystal having no dislocation, and then a shoulder portion is formed, after which the other shoulder portion is formed to give a target body diameter.

When the body length of the crystal has reached, for example, 300 mm, pulling rate of the crystal is controlled to be sufficiently higher than its critical rate (for example, 1.0 mm/min), following which the pulling rate is decreased almost linearly according to the length of the crystal pulled up. When the body length has reached, for example, 600 mm, the pulling rate is decreased so as to become lower than the critical rate (for example, 0.3 mm/min), after which the body portion is grown so as to reach a length of, for example, 1600 mm at such a pulling rate. And then, the crystal is subjected to tail drawing under normal conditions, following which the growth of the crystal is finished.

The single crystals thus grown by using the various hydrogen concentrations are cut longitudinally along the pulling axes to produce platy test specimens including portions near the pulling axes, and then the specimens are subjected to Cu decoration to observe the distribution of grown-in defects. Initially, the individual specimens are dipped into a copper sulfate water solution, then air-dried, and heat treated in a nitrogen atmosphere at a temperature of 900° C. for about 20 minutes. Thereafter, to remove the Cu silicide surface layers of the specimens, they are dipped into a HF/HNO$_3$ mixed solution, and then the surface layers of the specimens are removed by several tens of microns through etching. After that, the locations of OSF rings and the distributions of individual defect regions are studied by using X-ray topography. Also, the COP densities of the specimens are studied by using, for example, OPP and the densities of dislocation clusters are studied by using, for example, Secco etching.

Through such a pulling experiment, it is possible to obtain a relationship between the V/G ratios and the hydrogen concentrations of the individual defect regions of the infrared scattering defect developing region, the OSF developing region, the PV region, the PI region, and the dislocation cluster developing region. Moreover, by setting several points at which the pulling rate is changed in a manner that chooses different size portions such as 300 mm to 600 mm, 500 mm to 800 mm, and 700 mm to 1000 mm, a relationship between the pulling rate margin of a defect-free crystal comprising an oxide precipitation inhibiting region (PI region) and a location in the axial direction of the crystal can be obtained, which makes it possible to set operational conditions to grow a defect-free crystal comprising an oxide precipitation inhibiting region (PI region).

[Growth of Silicon Single Crystal]

Next, by using the CZ furnace shown in FIG. 8 and a mixed gas of an inert gas and hydrogen gas as an atmospheric gas used for growth of the single crystal, the silicon single crystal 6 whose body portion is a defect-free region comprising an oxide precipitation inhibiting region (PI region) is grown under suitable operational conditions set by using the method described above.

After the silicon single crystal has been grown in this way, the crystal is worked according to a conventional processing method. That is, the silicon single crystal is sliced with a cutting device such as an ID saw or a wire saw and then worked into silicon single crystal wafers through various fabrication steps such as chamfering, lapping, etching, and polishing. Furthermore, there are various steps such as cleaning in addition to these steps. Such steps can be changed suitably in accordance with the purpose in such a way as to change the order of the steps and allow omission of some steps.

By subjecting the wafers thus obtained to RTA, it is possible to obtain excellent wafers having an oxide precipitate density of $1 \times 10^4$ to $1 \times 10^6$ pieces/cm$^2$ allowing a sufficient gettering capability, a desired size, and a sufficient DZ width. In such wafers, a device active region is completely defect-free and is formed uniformly in the surface of the wafers. By this method, it is possible to avoid a heat treatment at an elevated temperature and a prolonged time period for generating the outward diffusion of oxygen during the formation of the DZ layer.

According to the method for growing a silicon single crystal of this embodiment, since the mixed gas of the inert gas and hydrogen gas is used as the atmospheric gas for growing the single crystal and the temperature of the silicon single crystal is controlled during the crystal growth such that the ratio Gc/Ge of the axial thermal gradient Gc at the central portion of the crystal between its melting point and 1350° C. to the axial thermal gradient Ge at the periphery of the crystal between its melting point and 1350° C. is 1.1 to 1.4 and that the axial thermal gradient Gc at the central portion of the crystal is 3.0 to 3.5° C./mm, the pulling rate margin of a defect-free crystal increases. Therefore, it is possible to grow a silicon single crystal using a pulling rate margin with which the mixed region of the OSF developing region, the PV region, and the PI region is avoided. As a result, it is not necessary to lower the oxygen concentration to $12 \times 10^{17}$ atoms/cm$^3$ (ASTM-F121 1979) or lower to reduce the occurrence of the OSFs and a silicon single crystal having oxygen concentration of $12 \times 10^{17}$ to $18 \times 10^{17}$ atoms/cm$^3$ (ASTM-F121 1979) can be manufactured.

In the embodiment described above, the example in which the side surface of the silicon single crystal is forced to cool with the water cooling unit 8 (cooling unit) during the crystal growth has been described; however, the invention is not limited only to the case where the side of the silicon single crystal is cooled with the water cooling unit 8 (cooling unit) during the crystal growth and hence, any other unit may be used provided that the side of a silicon single crystal can be cooled with the unit during the growth of the crystal.

EXAMPLES

To verify the invention, experiments described below have been carried out.

Examples 1 to 3

Using a growth apparatus having the undermentioned hot zone structure 1, under operation conditions determined by the above-described method, defect-free crystals of silicon single crystals having oxygen concentrations shown in Table 1 were grown as an embodiment of the present invention. A crucible is charged with 300 kg of polycrystalline silicon of high purity. A mixed gas mixing hydrogen into argon was used as an atmospheric gas. In the mixed gas, hydrogen gas was mixed to have a hydrogen molecule partial pressure of 240 Pa. The silicon single crystals were grown to have a diameter of 300 mm and a body length of 1600 mm.

TABLE 1

| Example | Oxygen Concentration ($\times 10^{17}$ atoms/cm$^3$) | OSF Concentration (pieces/cm$^2$) | Crystal Region |
| --- | --- | --- | --- |
| 1 | 13-14 | 14 | PV Region + PI Region |
| 2 | 13-14 | 0 | PI Region |
| 3 | 14-15 | 0 | PI Region |

[Hot Zone Structure 1]

The CZ furnace shown in FIG. 8 was used. The water cooling unit 8 had a cooling capacity expressed in the form of its inside diameter of 600 mm and height of 200 mm. The water cooling unit 8 was placed such that a height from the surface of the melt to the bottom surface of the water cooling unit 8 is set at 150 mm. A horizontal magnetic field of 3000 G was supplied from the magnetic field supply apparatus 9 such that a height from the surface of the melt to the center of the magnetic field is set at about 0 mm. A hot zone structure was provided to realize an axial thermal gradient Gc of 3.2° C./mm at the central portion of the crystal between the melting point thereof and 1350° C., an axial thermal gradient Ge of 2.2° C./mm at the periphery of the crystal, and a Gc/Ge ratio of 1.3.

Examples 4 and 5

Using a crystal growth apparatus having the undermentioned hot zone structure 2 defect-free crystals of silicon single crystals having oxygen concentrations shown in Table 2 were grown as comparative examples of the present invention. As like as Example 1, crucible is charged with 300 kg of polycrystalline silicon of high purity. Argon was used as an atmospheric gas. The silicon single crystals were grown to have a diameter of 300 mm and a body length of 1600 mm.

TABLE 2

| Example (Comparative) | Oxygen Concentration ($\times 10^{17}$ atoms/cm$^3$) | OSF Concentration (pieces/cm$^2$) | Crystal Region |
|---|---|---|---|
| 4 | 11.5-12.5 | 70 | OSF Region + PV Region + PI Region |
| 5 | 13-14 | >1000 | OSF Region + PV Region + PI Region |

[Hot Zone Structure 2]

A CZ furnace having neither the water cooling unit 8 nor the heat shield 7 was used. A horizontal magnetic field was supplied as in the case of the hot zone structure 1. A hot zone structure was provided to realize an axial thermal gradient Gc of 2.8° C./mm at the central portion of the crystal between its melting point and its temperature of 1350° C., an axial thermal gradient Ge of 2.5° C./mm at the periphery of the crystal, and a Gc/Ge ratio of 1.1.

The silicon single crystals obtained in Examples 1 to 5 were sliced into silicon wafers. The wafers were heat treated at a temperature of 1000° C. for 16 hours. After which the OSF concentrations of the wafers were measured by using an etch pit method. Results of these measurements are indicated in Tables 1 and 2.

The measurement of the OSF concentrations by the etch pit method was carried out by subjecting the silicon wafers to a heat treatment for evaluation at a temperature 1000° C. for 90 minutes, removing the oxide films of the wafers with a mixed solution of fluoric acid and pure water, selectively etching the OSFs occurring in the surfaces of the wafers by Secco etching to visualize the OSFs, and observing the density of OSFs with an optical microscope.

After subjecting the individual silicon wafers of Examples 1 to 5 individually to the above-described heat-treatment, densities of BMDs formed inside the silicon wafers were measured and a relationship between a distance from the center of each silicon wafer and the BMD density was studied. The results are indicated in FIG. 9 and FIG. 10.

The measurement of BMD densities were carried out by additionally heat treating the heat-treated silicon wafers at a temperature of 1000° C. for 16 hours in an oxidizing atmosphere to grow precipitates, cleaving the wafers, removing the surface portions of the wafers by 2 microns through the use of wet etching (light etching), and counting pits in the surfaces as cleavage planes of the wafers with an optical microscope (infrared scattering method).

From the measurement results of the BMD densities and the OSF concentrations, the defective regions of the silicon wafers were studied. Results of the study are indicated in Tables 1 and 2.

Figure 9:
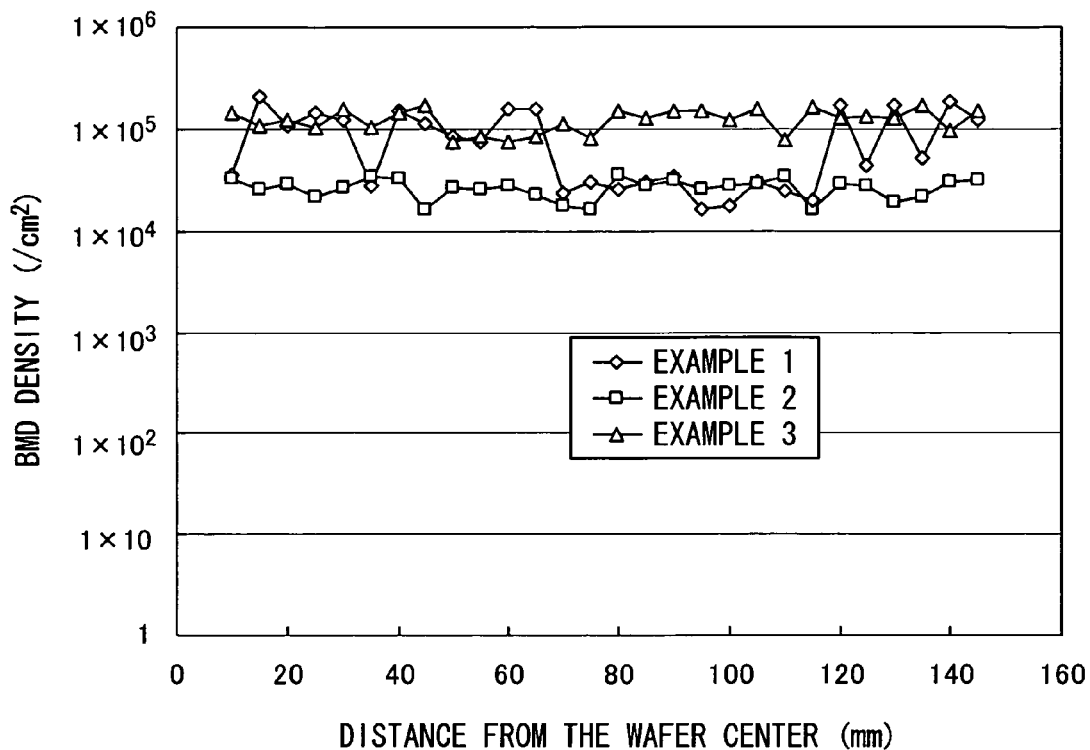
FIG. 9 is a graph for explaining a relationship between a distance from the center of a silicon wafer and a BMD density.
Figure 10:
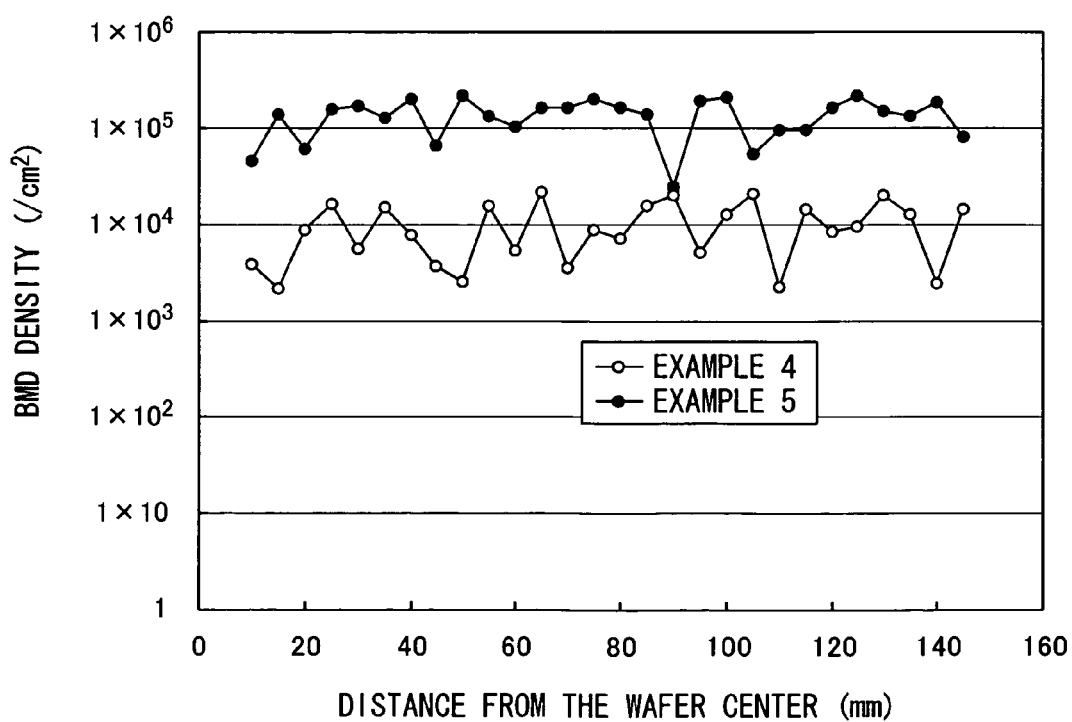
FIG. 10 is a graph for explaining a relationship between a distance from the center of a silicon wafer and a BMD density.

As shown in FIG. 9, in Example 1 as an embodiment of the invention, the BMD densities were counted to be $1 \times 10^5$ pieces/cm$^2$ or higher in the region having a distance of 10 mm to 70 mm from the center of the silicon wafer and in the region having a distance of 120 mm to 145 mm from the center of the wafer. The BMD densities were counted to be $1 \times 10^4$ pieces/cm$^2$ or higher in the region having a distance from the center of the wafer of 70 mm to 120 mm. Hence, the wafer can provide a sufficient gettering capability. Additionally, in Example 1, only few OSFs occurred.

In Example 1, it was observed that the region having a distance of 10 mm to 70 mm from the center of the silicon wafer and the region having a distance of 120 mm to 145 mm from the center of the silicon wafer are PV regions, the region having a distance of 70 mm to 120 mm from the center of the silicon wafer is a PI region, and the PV region and the PI region are present concurrently as shown in Table 1.

As shown in FIG. 9 in Example 2 as an embodiment of the invention, a BMD densities were counted to be $1 \times 10^4$ pieces/cm$^2$ or higher and were uniform across the entire surface of the silicon wafer. Hence the silicon wafer provides a sufficient gettering capability. Additionally, in Example 2, it was observed that no OSF occurs in the wafers, and that the wafers only comprise the PI region.

As shown in FIG. 9, in Example 3 as an embodiment of the invention, the BMD densities were counted to be on the order of $1 \times 10^5$ pieces/cm$^2$ and are uniform across the entire surface of the silicon wafer. Hence the wafers can provide an excellent gettering capability. Moreover, in Example 3, it was observed that no OSF occurs and the wafers only comprise the PI region.

In contrast, as shown in FIG. 10, in Example 4 as a comparative example of the invention, BMD densities are on the order of $1 \times 10^4$ pieces/cm$^2$ and varies largely in the surface of the silicon wafer compared with those shown in Examples 1 to 3 as the embodiments of the invention. Additionally, in Example 4, as shown in Table 2, despite the fact that the oxygen concentration is lowered, many OSFs are observed compared with those shown in Examples 1 to 3 as the embodiments of the invention.

Moreover, in Example 4, as shown in Table 2, it was observed that the OSF region, the PV region, and the PI region are present concurrently in the wafer.

As shown in FIG. 10, in Example 5 as a comparative example of the invention, BMD densities were on the order of $1 \times 10^5$ pieces/cm$^2$. As shown in Table 2, despite the fact that the oxygen concentration is the same as those shown in Examples 1 and 2 as the embodiments of the invention, it was observed extremely large number of OSFs exceeding detection limit.

Additionally, as shown in Table 2, concurrent occurrence of the OSF region, the PV region, and the PI region was observed in Example 5.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for growing a silicon single crystal having a body portion composed of an oxide precipitation inhibiting region and having an oxygen concentration of $12 \times 10^{17}$ to $18 \times 10^{17}$ atoms/cm$^3$ on ASTM-F121 1979 by the Czochralski method, comprising:

using a gas containing a gaseous substance containing hydrogen atoms as an atmospheric gas used for growing the single crystal;

controlling a temperature of the silicon single crystal during its growth such that a ratio Gc/Ge of an axial thermal gradient Gc at the central portion of the crystal between a melting point thereof and 1350° C. to an axial thermal gradient Ge at the periphery of the crystal between the melting point thereof and 1350° C. is 1.1 to 1.4, and the axial thermal gradient Gc at the central portion of the crystal is 3.0 to 3.5° C./mm;

setting a hydrogen molecule partial pressure of the gaseous substance containing hydrogen atoms in the atmospheric gas at 160 to 400 Pa;

determining a relationship between V/G ratios and hydrogen concentrations of individual regions of an infrared scattering defect developing region, an OSF developing region, an oxide precipitation promoting region, an oxide precipitation inhibiting region, and a dislocation cluster developing region, thereby determining the allowable range of hydrogen concentration and a pulling rate for growing a silicon single crystal whose body portion is composed of an oxide precipitation inhibiting region; and setting a pulling rate within the determined allowable range.

2. The method for growing a silicon single crystal according to claim 1, comprising cooling a side surface of the silicon single crystal during the crystal growth.

3. The method for growing a silicon single crystal according to claim 1, wherein the oxygen concentration is $13 \times 10^{17}$ to $16 \times 10^{17}$ atoms/cm$^3$ on ASTM-F121 1979.

4. The method for growing a silicon single crystal according to claim 1, wherein a time period for passing a temperature range of the silicon single crystal from 1000° C. to 800° C. is from 80 to 180 minutes.

5. A method for manufacturing a silicon wafer having an oxide precipitates density of $1 \times 10^4$ to $1 \times 10^6$ pieces/cm$^2$ comprising:

working a body portion of the silicon single crystal grown by the method for growing a silicon single crystal according to claim 1 into the silicon wafer.

6. A silicon wafer manufactured by the method for manufacturing a silicon wafer according to claim 5.

* * * * *